United States Patent
Huber

(10) Patent No.: US 10,992,263 B2
(45) Date of Patent: Apr. 27, 2021

(54) HIGH FREQUENCY YTTRIUM IRON GARNET OSCILLATOR AS WELL AS METHOD OF MANUFACTURING A HIGH FREQUENCY YTTRIUM IRON GARNET OSCILLATOR

(71) Applicant: Rohde & Schwarz GmbH & Co. KG, Munich (DE)

(72) Inventor: Florian Huber, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 0 days.

(21) Appl. No.: 16/536,533

(22) Filed: Aug. 9, 2019

(65) Prior Publication Data
US 2020/0052650 A1    Feb. 13, 2020

(30) Foreign Application Priority Data
Aug. 9, 2018   (EP) ..................... 18188346

(51) Int. Cl.
*H03B 5/18* (2006.01)

(52) U.S. Cl.
CPC ... *H03B 5/1882* (2013.01); *H03B 2201/0241* (2013.01)

(58) Field of Classification Search
CPC .......... H03B 5/1882; H03B 2201/0241; H03B 9/142
See application file for complete search history.

(56) References Cited

U.S. PATENT DOCUMENTS

| | | | |
|---|---|---|---|
| 4,247,837 A * | 1/1981 | Mezak ................... | H01P 1/218 333/202 |
| 5,568,106 A * | 10/1996 | Fang ..................... | H01P 1/2039 333/202 |
| 5,615,473 A | 4/1997 | Dydyk et al. | |
| 6,259,331 B1 * | 7/2001 | Ezura ..................... | H01P 1/218 331/117 D |
| 6,313,711 B1 * | 11/2001 | Korber, Jr. ........... | H03B 5/1882 331/176 |
| 6,326,856 B1 | 12/2001 | Andersson | |
| 2002/0105390 A1 | 8/2002 | Kobayashi et al. | |

FOREIGN PATENT DOCUMENTS

DE      102009009655 A1    9/2010

OTHER PUBLICATIONS

Ohwi, K., et al., "A Three-Port Ferrite Resonator Circuit Using Coplanar Waveguide," 8108 I.E.E.E. Transactions on Magnetics 23(5):3748-3750, Sep. 1987.
Vanhoenacker, D., et al., "Microwave Undergraduate Education at UCL Belgium: From Planar Passive Components to Wide Band Tuned Devices," Microwaves UCL, pp. 798-803, Oct. 1995.

* cited by examiner

*Primary Examiner* — Jeffrey M Shin
(74) *Attorney, Agent, or Firm* — Christensen O'Connor Johnson Kindness PLLC

(57) ABSTRACT

A high frequency yttrium iron garnet oscillator is described that comprises a coplanar yttrium iron garnet resonator. The coplanar yttrium iron garnet resonator has an yttrium iron garnet sphere, a coplanar coupling structure and a coplanar waveguide. The coplanar coupling structure is integrated with the coplanar waveguide. The coplanar coupling structure is coupled to the yttrium iron garnet sphere. Further, a method of manufacturing a high frequency yttrium iron garnet oscillator is described.

19 Claims, 3 Drawing Sheets

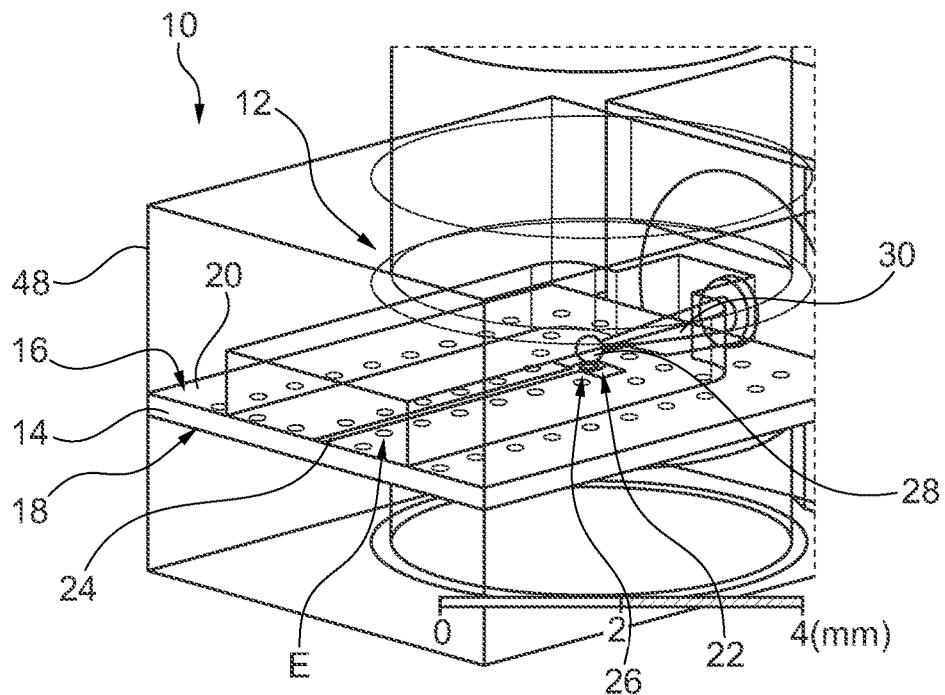
Fig. 1
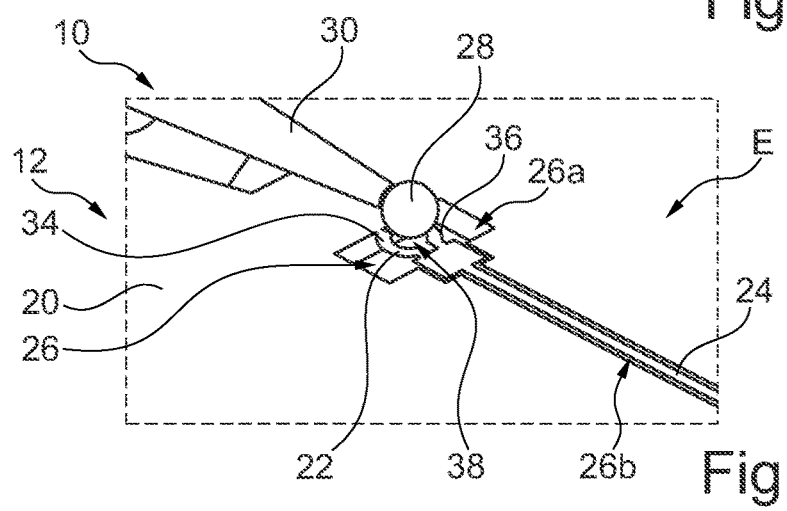
Fig. 2
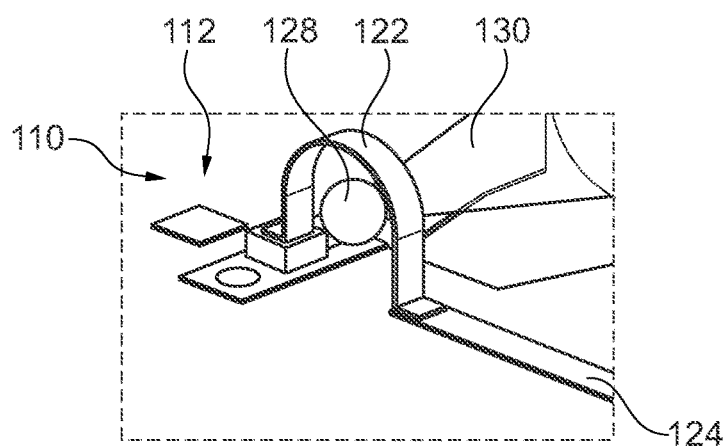
-Prior art-  Fig. 3

HIGH FREQUENCY YTTRIUM IRON GARNET OSCILLATOR AS WELL AS METHOD OF MANUFACTURING A HIGH FREQUENCY YTTRIUM IRON GARNET OSCILLATOR

FIELD OF THE DISCLOSURE

The present disclosure relates to a high frequency yttrium iron garnet (YIG) oscillator as well as a method of manufacturing a high frequency YIG oscillator.

BACKGROUND

It is known from the state of the art that YIG oscillators are used as reference sources for generating a signal of a local oscillator which may be used in a signal generator and/or a spectrum analyzer. The YIG oscillators have an yttrium iron garnet resonator (YIG resonator) having an yttrium iron garnet sphere (YIG sphere) that is assigned to a coupling structure. The coupling structure is established by a conduction band made of gold. The conduction band is formed like a small loop that substantially surrounds the YIG sphere so that the conduction band is enabled to excite the YIG sphere in an electromagnetic manner appropriately. The coupling structure is also called coupling loop and it is electrically long due to its respective shape. In addition, a strong frequency dependent coupling strength is provided that is linked to the electrical length of the coupling structure.

Thus, the frequency range usable by the YIG oscillators is typically limited to about 20 GHz due to the natural resonance of the coupling structure, in particular the natural resonance of the conduction band.

Therefore, technical modifications are necessary to obtain higher output frequencies which result in high efforts with regard to the hardware used. For instance, frequency doublers, filter banks and/or amplifiers have to be used in order to obtain higher output frequencies.

However, these additional hardware components result in a performance reduction with regard to phase noise as a higher phase noise or rather phase jitter occurs while using the additional hardware components so as to obtain higher output frequencies. This phase noise is unwanted since it reduces the overall performance of the oscillator.

In the state of the art, a trade-off is required between the output frequencies and the phase noise once higher output frequencies were wanted, namely output frequencies higher than 20 GHz due to the natural resonance of the coupling structure limiting the usable frequency range of the oscillator.

SUMMARY

Accordingly, there is a need for a YIG oscillator that can be used for high output frequencies while ensuring good performance with regard to phase noise.

The present disclosure provides a high frequency yttrium iron garnet oscillator with a coplanar yttrium iron garnet resonator. In an embodiment, the coplanar yttrium iron garnet resonator comprises an yttrium iron garnet sphere, a coplanar coupling structure and a coplanar waveguide. In an embodiment, the coplanar coupling structure is integrated with the coplanar waveguide and the coplanar coupling structure is coupled to the yttrium iron garnet sphere.

Further, the present disclosure provides a method of manufacturing a high frequency yttrium iron garnet oscillator. In an embodiment, the method includes the following steps:

providing a substrate;

applying a coplanar coupling structure on at least a portion of the first substrate by using thin-film techniques; and placing an yttrium iron garnet sphere in proximity of the coplanar coupling structure so that an electromagnetic coupling between the yttrium iron garnet sphere and the coplanar coupling structure is obtained.

Accordingly, a high frequency yttrium iron garnet oscillator is provided that can be used for high frequency applications while providing low phase noise due to the fact that the coplanar coupling structure has a reduced reflection loss or rather return attenuation as well as a high natural resonant frequency or rather self-resonant frequency in comparison to yttrium iron garnet oscillator known. Therefore, the YIG oscillator according to the disclosure can be used for high frequencies applications, namely frequencies higher than 30 GHz, in particular higher than 35 GHz. Such high frequency signals can be generated by the high frequency YIG oscillator while ensuring a low phase noise simultaneously. This can be ensured since the natural resonant frequency limiting the frequency range usable is shifted to higher frequencies such as frequencies higher than 30 GHz due to the smaller electrical length of the coupling structure. Hence, the coplanar coupling structure is electrically short as the coupling structure is provided in a coplanar manner. Therefore, the coupling strength remains substantially the same over the respective frequency range. In fact, the coupling strength is independent of the frequency.

Thus, the coplanar coupling structure may be configured so as to have low losses at high frequencies, for example frequencies higher than 20 GHz, due to the smaller electrical length of the coupling structure.

Generally, the costs for manufacturing a high frequency yttrium iron garnet oscillator that ensures high output frequencies, namely frequencies higher than 30 GHz, can be reduced since additional hardware components are not required. Thus, the additional hardware components employed in the state of the art, such as frequency doublers, filters, filter banks and/or amplifiers, may be omitted in embodiments of the disclosure. In addition, the high frequency yttrium iron garnet oscillator simultaneously ensures a low phase noise while providing signals at such high frequencies. In the state of the art, the additional hardware components reduce the overall performance of the oscillator as the phase noise was increased.

The coplanar coupling structure is coupled to the yttrium iron garnet sphere in an electromagnetic manner so that an electromagnetic coupling is provided, for example by a magnetic field generated. This means that a distance or rather a gap is provided between the coplanar coupling structure and the yttrium iron garnet sphere. The distance or rather the gap can be electromagnetically bridged so that the coplanar coupling structure is configured to excite the yttrium iron garnet sphere.

Thus, the resonator ensures that the yttrium iron garnet sphere can be excited via the coplanar coupling structure wherein the sphere excited excites in turn the coplanar coupling structure so as to emit a radio frequency signal at the desired frequency.

The overall coplanar coupling structure is provided in a plane. For example, the coplanar coupling structure and the coplanar waveguide are provided in the same plane. The overall size of the yttrium iron garnet oscillator can be reduced appropriately. Hence, the coupling loop known in the prior art is no more necessary and replaced by the coplanar coupling structure arranged in a plane.

The yttrium iron garnet sphere has a spherical shape. Thus, the yttrium iron garnet sphere is shaped like a ball, as it is round.

Accordingly, the yttrium iron garnet resonator is named coplanar, as it comprises the coplanar coupling structure. However, the yttrium iron garnet resonator also comprises the three dimensional yttrium iron garnet sphere.

In some embodiments, the coplanar coupling structure of the coplanar yttrium iron garnet resonator may be short-circuited at an end being opposite to the end of the coplanar coupling structure that is connected with the coplanar waveguide.

Since the coplanar coupling structure is integrated with the coplanar waveguide, both components of the coplanar yttrium iron garnet resonator, namely the coplanar coupling structure and the coplanar waveguide, are connected with each other in a signal transmitting manner. For example, the coplanar coupling structure and the coplanar waveguide may be formed in one piece.

Generally, signals with low phase noise at high frequencies may be provided by a local oscillator established by the YIG oscillator according to the disclosure.

According to an aspect, the coplanar coupling structure is substantially ring shaped. Thus, a specific mode in the YIG sphere can be excited by the coplanar coupling structure at a low distance between the coplanar coupling structure and the YIG sphere in an improved manner.

Hence, the quality factor of the yttrium iron garnet oscillator can be maintained. In contrast thereto, a plane or disc-shaped coupling structure would excite several modes in the YIG sphere which would result in a reduced quality factor of the yttrium iron garnet oscillator.

In other words, the phase noise may be maintained low.

Another aspect provides that the ratio of the diameter of the ring shaped coplanar coupling structure and the diameter of the yttrium iron garnet sphere is between 0.7 to 1.4. Therefore, the diameters of both components of the coplanar yttrium iron garnet resonator have substantially the same dimension so that the electromagnetic coupling is improved resulting in a high quality factor or rather low phase noise.

For instance, the diameter of ring shaped coplanar coupling structure corresponds to the diameter of the yttrium iron garnet sphere. Thus, both components of the resonator, namely the sphere and the ring shaped coplanar coupling structure, have the same diameter. Accordingly, a projection of the YIG sphere on the coplanar coupling structure or rather the plane in which the coplanar coupling structure is provided corresponds to the area encircled by the outer edge of the coplanar coupling structure.

According to another aspect, the coplanar yttrium iron garnet resonator has a recess portion that is assigned to the coplanar coupling structure. The recess portion may be opposite to the coplanar coupling structure so that the coplanar coupling structure is placed between the yttrium iron garnet sphere, for example a side facing the coplanar coupling structure, and the recess portion of the coplanar YIG resonator. The recess portion ensures that the coplanar coupling structure is substantially free of surrounding material that may disturb the electromagnetic coupling between the YIG sphere and the coplanar coupling structure.

In some embodiments, the recess portion has two recess areas that merge into each other, wherein a first recess area is assigned to the coplanar coupling structure and/or wherein a second recess area is assigned to the coplanar waveguide. Accordingly, the recess portion comprises two areas assigned to the conducting portions of the resonator, namely the coplanar coupling structure interacting with the YIG sphere and the coplanar waveguide connected to the coplanar coupling structure.

For instance, the coplanar yttrium iron garnet resonator has a substrate, in particular a ceramic substrate, with a first surface on which the coplanar coupling structure and/or the coplanar waveguide are/is provided, in particular directly provided. The coplanar coupling structure as well as the coplanar waveguide may be located in the same plane that is defined by the first surface of the substrate. Generally, the substrate may be established by a dielectric material. The coplanar coupling structure and/or the coplanar waveguide may be directly provided on the substrate, namely its first surface. Thus, no intermediate material may be provided between the coplanar coupling structure and/or the coplanar waveguide and the substrate.

In some embodiments, at least the first surface of the substrate is partially provided with an electrically conductive material. The electrically conductive material may define a first grounding area on the first surface which influences the electromagnetic coupling between the coplanar coupling structure and the YIG sphere so that radiation losses of the resonator can be reduced. The electrically conductive material applied next to the coplanar coupling structure may establish the short-circuit of the coplanar coupling structure.

In some embodiments, the substrate has a second surface opposite to the first surface that is also partially provided with an electrically conductive material. The electrically conductive material on the second surface may define a second grounding area on the second surface which also influences the electromagnetic coupling between the coplanar coupling structure and the YIG sphere. For instance, the same electrically conductive material is used for both grounding areas. The respective electrically conductive materials may be connected with each other.

Moreover, the recess portion may be provided within the electrically conductive material, for example wherein the first surface of the substrate is substantially fully covered with electrically conductive material except for the recess portion. Thus, the recess portion defines an area on the first surface that is free of electrically conductive material so that the coplanar coupling structure and/or the coplanar waveguide may be provided in the recessed portion.

In some embodiments, the coplanar coupling structure and/or the coplanar waveguide may be established by a thin-film, for example a deposited thin-film made of gold. For instance, the coplanar coupling structure and/or the coplanar waveguide may be established by coating or rather evaporating the first surface of the substrate appropriately. Thus, coplanar coupling structure and/or the coplanar waveguide may correspond to a coated or rather vaporized coplanar coupling structure and a coated or rather vaporized coplanar waveguide, respectively. Accordingly, the coplanar coupling structure and/or the coplanar waveguide may be established in a cost-efficient manner. For instance, the coplanar coupling structure and the coplanar waveguide are provided on the substrate, in particular its first surface, simultaneously.

The respective electrically conductive material may be deposited on the substrate prior to the coplanar coupling structure and/or the coplanar waveguide. Alternatively, the respective electrically conductive material is applied on the substrate after the coplanar coupling structure and/or the coplanar waveguide were/was applied on the substrate, for example its first surface. Furthermore, the electrically conductive material, the coplanar coupling structure and/or the coplanar waveguide are applied on the substrate in one processing step.

Another aspect provides that the minimum distance between the yttrium iron garnet sphere and the coplanar coupling structure is between 100 µm and 150 µm. The coplanar coupling structure is arranged in a plane that is distanced to the yttrium iron garnet sphere. The minimal distance between the yttrium iron garnet sphere and the coplanar coupling structure or rather the respective plane is established between the side of the yttrium iron garnet sphere directly facing the coplanar coupling structure, namely the lower side of the yttrium iron garnet sphere. The minimal distance of 100 µm to 150 µm ensures that a good electromagnetic coupling between the coplanar coupling structure and the yttrium iron garnet sphere is obtained so that radiation losses can be reduced appropriately.

Moreover, a holder may be provided that holds the yttrium iron garnet sphere. Thus, the yttrium iron garnet sphere is suspended by the holder so that it is located at a pre-defined location with respect to the coplanar coupling structure. The holder may be made of a dielectric material, for instance a ceramic.

In addition, a shielding cover may be provided that houses the coplanar yttrium iron garnet resonator, for example wherein the shielding cover is made of a metal and/or gold-coated. The shielding cover ensures that the radiation losses can be further reduced. In fact, the shielding cover may be placed on the electrically conductive material so that the electrically conductive shielding cover is connected to the electrically conductive material.

For instance, the shielding cover is at least coated with the same material that is used as the electrically conductive material.

Generally, the respective electrically conductive material may provide mass or rather ground.

Hence, the shielding cover is connected to mass or rather ground.

The coplanar coupling structure and/or the coplanar waveguide may be established by strip lines. As the respective components of the YIG resonator may be established by coating or rather vaporizing the substrate, the components of the YIG resonator can be established in a cost-efficient manner. Accordingly, the whole YIG resonator can be manufactured in a cost-efficient manner.

Further, a coplanar waveguide may also be applied on parts of the first surface of the substrate, for example wherein the coplanar coupling structure and the coplanar waveguide are formed simultaneously. Thus, the whole yttrium iron garnet resonator may be established in a cost-efficient manner since the electrically conducting material such as the coplanar waveguide and the coplanar coupling structure may be applied in the same processing step.

The further features mentioned above also apply for the method so that the coplanar coupling structure may be applied in a ring shaped manner during the manufacturing of the high frequency yttrium iron garnet oscillator. The ring shaped coplanar coupling structure may be adapted with regard to its diameter to the one of the yttrium iron garnet sphere.

Further, a recess portion may be provided during the manufacturing of the high frequency yttrium iron garnet oscillator, for instance when the electrically conductive material is deposited on the first surface of the substrate so that the coplanar coupling structure and/or the coplanar waveguide may be applied directly on the substrate.

After the coplanar coupling structure, the coplanar waveguide and/or the electrically conductive material have been applied on the substrate, a shielding cover may be placed over the coplanar yttrium iron garnet resonator so that the shielding cover houses the coplanar yttrium iron garnet resonator. The shielding cover may be contacted in an electrical manner with the electrically conductive material placed on the substrate so that the shielding cover itself is assigned to the ground or rather mass.

Generally, the frequency of the YIG oscillator may be adapted by using an external magnetic field interacting with the YIG sphere. The external magnetic field, for instance generated by an electromagnet, changes the resonance frequency of the YIG sphere and, therefore, the characteristics of the YIG oscillator in total.

For example, the YIG sphere may act as a tunable frequency-determining member of the YIG oscillator for microwave frequencies, namely high frequencies.

In addition, the YIG sphere may be doped so as to adapt the usable frequency range, for instance by gallium.

The YIG oscillator may also have high linearity besides the low phase noise so as to provide a good performance in general.

In general, the signals reflected by the YIG resonator are used for further processing. For this purpose, the YIG resonator, for example the coplanar coupling structure, is short-circuited.

The YIG sphere may be made of a synthetic Yttrium Iron Garnet crystalline structure wherein the spherical shape is obtained by dicing and tumbling.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

FIG. 1 shows a perspective view of an example of a yttrium iron garnet oscillator according to the disclosure;

FIG. 2 shows a detail of the yttrium iron garnet oscillator according to FIG. 1 in another perspective;

FIG. 3 shows the same detail of FIG. 2 used by an yttrium iron garnet oscillator according to the state of the art;

DETAILED DESCRIPTION

Figure 4:
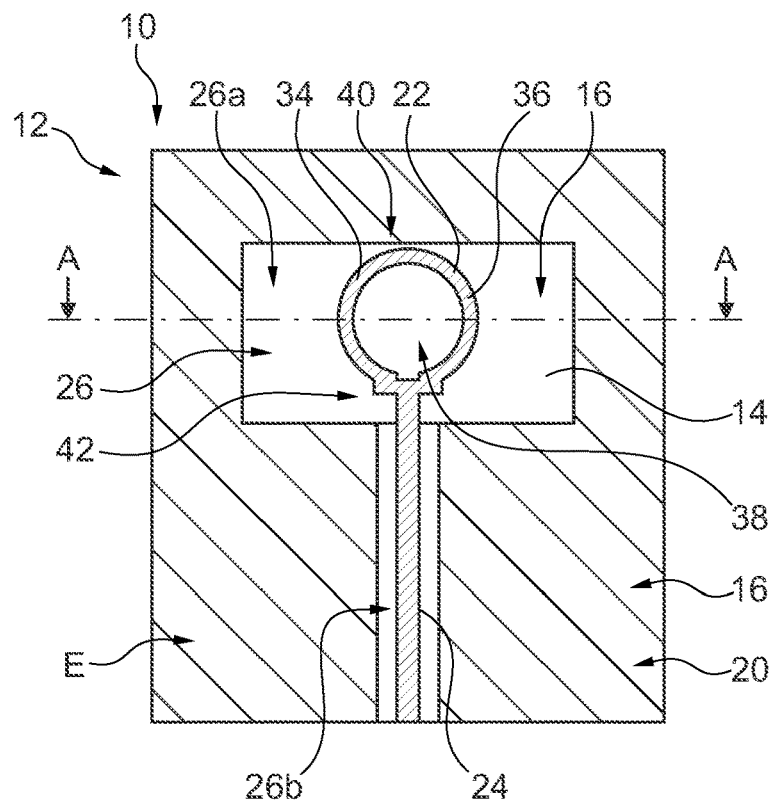
FIG. 4 schematically shows a top view on the upper side of the yttrium iron garnet oscillator according to FIG. 1.

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

In FIG. 1, a high frequency yttrium iron garnet oscillator 10 is shown that has a coplanar yttrium iron garnet resonator 12. The coplanar yttrium iron garnet resonator 12 comprises a substrate 14 having a first surface 16 and a second surface 18 that is opposite to the first surface 16. In general, the substrate 14 may be a ceramic substrate or made of any other dielectric material. The first surface 16 of the substrate 14 is covered with an electrically conductive material that provides a first grounding area 20 of the YIG resonator 12.

The YIG resonator 12 further comprises a coplanar coupling structure 22 as well as a coplanar waveguide 24 which are connected with each other. In other words, the coplanar coupling structure 22 is integrated with the coplanar waveguide 24. The coplanar coupling structure 22 as well as the coplanar waveguide 24 are also provided on the first surface 16 of the substrate 14 wherein the respective coplanar coupling structure 22 and the coplanar waveguide 24 are assigned to a recess portion 26 in the first grounding area 20.

The recess portion 26 comprises a first recess area 26a that is assigned to the coplanar coupling structure 22 and a second recess area 26b that is assigned to the coplanar waveguide 24. This means that the electrically conductive material assigned to the first grounding area 20 is not provided in an area of the first surface 16 that corresponds to the recess portion 26 so that the coplanar coupling structure 22 and the coplanar waveguide 24 can be applied on the first surface 16 of the substrate 14 directly.

The coplanar yttrium iron garnet resonator 12 also comprises an yttrium iron garnet sphere 28 that is held by a holder 30. The holder 30 may be made of a dielectric material such as a ceramic. The YIG sphere 28 is assigned to the coplanar coupling structure 22 so that an electromagnetic coupling is established between the yttrium iron garnet sphere 28 and the coplanar coupling structure 22. Therefore, a gap is provided between the yttrium iron garnet sphere 28 and the coplanar coupling structure 22.

In general, the sizes of the yttrium iron garnet sphere 28 and the coplanar coupling structure 22 are adapted to each other. Therefore, the coplanar coupling structure 22 is ring shaped which means that the coplanar coupling structure 22 has at least two arms 32 and 34 which limit a substantially circular area 38 of the recess portion 26.

The yttrium iron garnet sphere 28 may have a diameter that corresponds to the diameter of the ring-shaped coplanar coupling structure 22, for example the diameter of the outer edge of the ring-shaped coplanar coupling structure 22. For instance, the ratio of the diameters ranges between 0.7 to 1.4. In some embodiments, the diameter of the ring shaped coplanar coupling structure 22 corresponds to the diameter of the yttrium iron garnet sphere 28 so that both diameters are the same.

Thus, a projection of the yttrium iron garnet sphere 28 on the first surface 16 of the substrate 14 on which the coplanar coupling structure 22 is provided results in a perfect match so that the outer edge of the coplanar coupling structure 22 coincidences with the yttrium iron garnet sphere 28.

In some embodiments, the diameter(s) may range between 250 μm to 300 μm.

Generally, the coplanar yttrium iron garnet resonator 12 ensures that the coplanar coupling structure 22 is provided in a plane E. For example, the coplanar coupling structure 22 and the coplanar waveguide 24 are provided in the same plane E. Further, the electrically conductive material is also applied in this plane E. The overall size of the yttrium iron garnet resonator 12 can be reduced appropriately. In an embodiment, the plane E is provided by the first surface 16 of the substrate 14.

In contrast thereto, FIG. 3 shows that an yttrium iron garnet resonator 112 used by am yttrium iron garnet oscillator 110 according to the prior art is not assigned to a plane. In fact, a conduction band made of gold is provided that relates to a coupling structure 122. The conduction band is formed like a small loop that substantially surrounds the YIG sphere 128. The respective components having the same function are assigned to reference numbers that correspond to the ones used in FIG. 2, but raised by 100.

Comparing FIGS. 2 and 3 reveals that the electrical length of the coupling structure is reduced according to the disclosure. This results in shifting the natural resonant frequency of the coupling structure, which limits the frequency range usable, to higher frequencies such as frequencies higher than 30 GHz.

Figure 5:
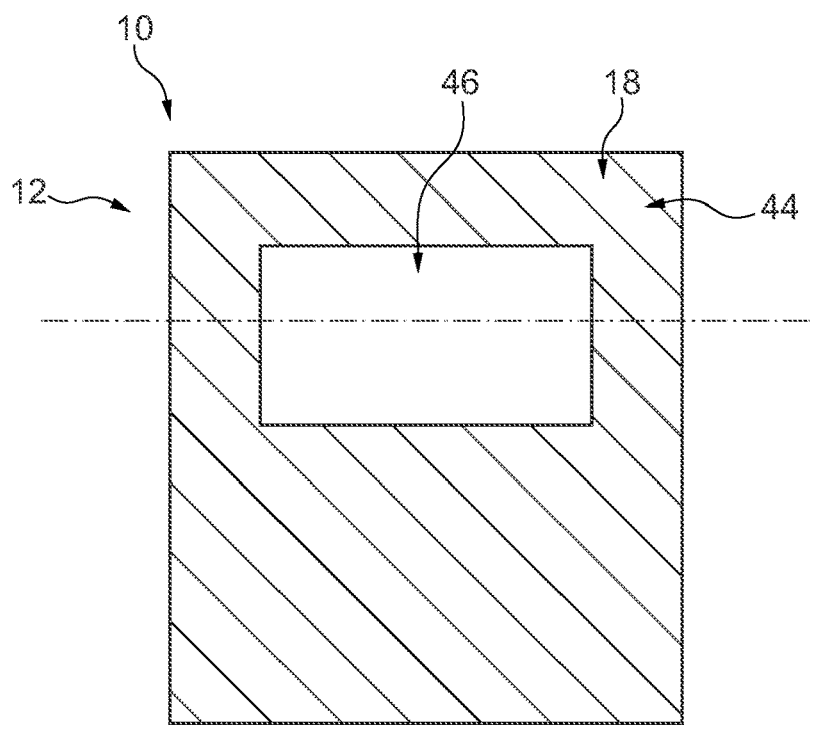
FIG. 5 shows a top view on the underside of the yttrium iron garnet oscillator according to FIG. 1.
Figure 6:
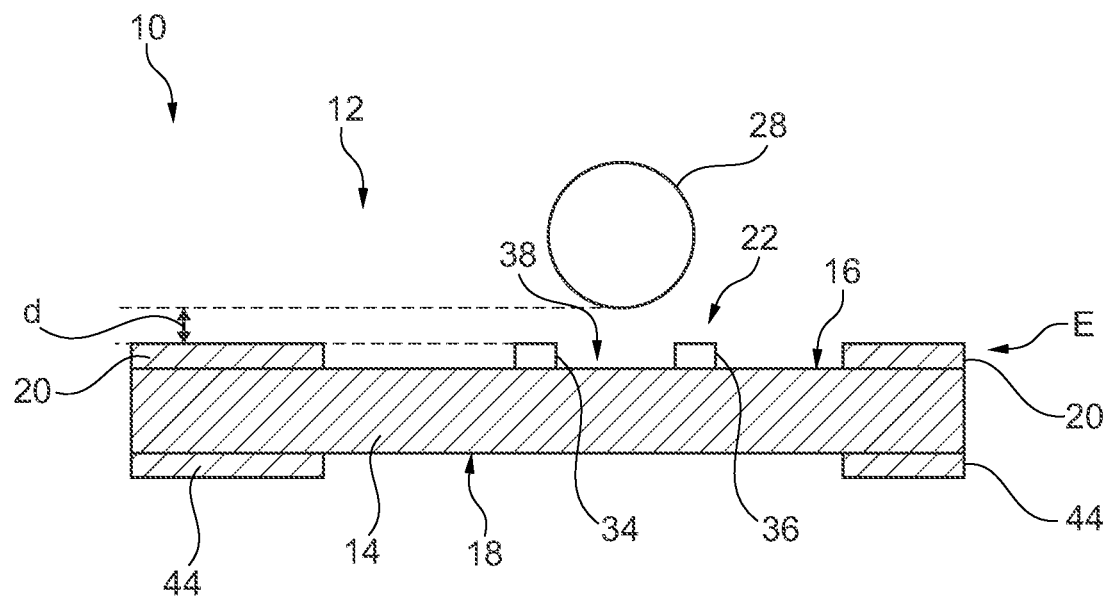
FIG. 6 shows a cross section through FIG. 4 along line A-A.

In FIGS. 4 to 6, the coplanar yttrium iron garnet resonator 12 used by the coplanar yttrium iron garnet oscillator 10 according to the disclosure is shown in different views. A top view on the upper side of the resonator 12 is shown in FIG. 4 whereas FIG. 5 reveals a top view on the opposite side of the resonator 12, namely the lower side. In FIG. 6, a cross section along line A-A shown in FIG. 4 is provided.

FIGS. 4 to 6 reveal that the arms 34, 36 of the coplanar coupling structure 22 are short-circuited at one end 40 of the coplanar coupling structure 22 wherein the coplanar coupling structure 22 is connected to the coplanar waveguide 24 via its opposite end 42.

As shown in FIG. 4, the coplanar coupling structure 22 is completely provided within the recess portion 26, for example the first recess area 26a, that is free of electrically conductive material. Furthermore, the electrically conductive material is also excluded from the second recess area 26b that is assigned to the coplanar waveguide 24 so that the coplanar waveguide 24 is also directly provided on the first surface 16 of the substrate 14.

Thus, electrically conductive material defining the first grounding area 20 may be provided over the entire first surface 16 of the substrate 14 except for the recess portion 26, in particular the first and second recess areas 26a, 26.

Therefore, the coplanar waveguide 24 as well as the coplanar coupling structure 22 are directly provided on the first surface 16 of the substrate 14. This becomes also obvious from FIG. 6 showing a cross section along line A-A of FIG. 4.

FIG. 6 also reveals that the coplanar coupling structure 22, for example its arms 34, 36 encircling the round area 38, has substantially the same height as the electrically conductive material defining the first grounding area 20.

It is further shown that the minimum distance d between the yttrium iron garnet sphere 28 and the coplanar coupling structure 22 is about 100 μm to 150 μm. The minimum distance corresponds to the distance between the coplanar coupling structure 22 and the side of the yttrium iron garnet sphere 28 facing the coplanar coupling structure 22, namely its lower side facing the substrate 14.

It is further shown in FIG. 6 that the second surface 18 of the substrate 14 is also provided with an electrically conductive material that defines a second grounding area 44 on the second surface 18.

This is shown in more detail in FIG. 5 illustrating the lower side of the yttrium iron garnet resonator 12, in particular the second surface 18 of the substrate 14 on which the second grounding area 44 is provided.

It becomes apparent that substantially the entire second surface 18 is covered with the electrically conductive material since only a surface area 46 is excluded from the electrically conductive material. The surface area 46 corresponds to the first recess area 26a assigned to the first surface 16.

Accordingly, it is ensured that the YIG sphere 28 only couples with the coplanar coupling structure 22 since no other electrical conductive material is provided in a projecting area of the YIG sphere 28 with regard to the substrate 14.

In other words, a projection of the YIG sphere 28 on the substrate 14 does not intersect the electrically conductive material of the grounding areas 20, 44 irrespective of the surface 16, 18.

In some embodiments, the surface area 46 and/or the first recess area 26a have a substantially rectangular shape.

It is further shown in FIG. 1 that the high frequency yttrium iron garnet oscillator 10 comprises a shielding cover 48 that is shown in a transparent manner so as to provide a better view on the coplanar yttrium iron garnet resonator 12 that is accommodated or rather housed by the shielding cover 48.

In some embodiments, the shielding cover 48 electromagnetically shields the YIG sphere 28 so that undesired electromagnetic coupling of the YIG sphere 28 with other components not intended is prevented. The shielding cover 48 may be made of a metal and/or gold-coated so that an electrical connection is obtained between the shielding cover and the grounding area(s) 20, 44 with which the shielding cover 48 is coupled. In an embodiment, the shielding cover 48 is connected to the grounding area 20 on the first surface 16 as shown in FIG. 1.

Figure 7:
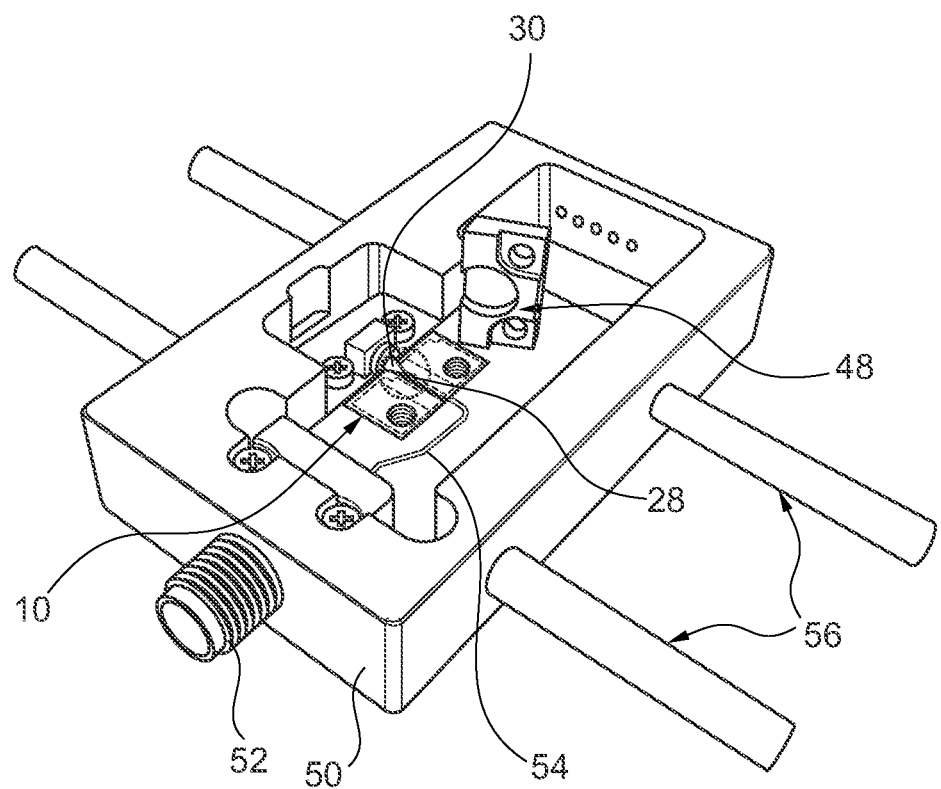
FIG. 7 shows the yttrium iron garnet oscillator of FIG. 1 with an additional housing and further components.

In FIG. 7, however, the yttrium iron garnet oscillator 10 is shown in an application. Thus, the YIG oscillator 10 is mounted in a housing 50 that comprises a radio frequency (RF) connector 52 connected to the coplanar waveguide 24 via a connection line 54. The connection line 54 may be established on a substrate, for example the substrate 14.

The respective shielding cover 48 is shown in more detail in FIG. 7 wherein the shielding cover 48 is disassembled from the coplanar yttrium iron garnet resonator 12 that is shown appropriately.

It becomes apparent that the shielding cover 48 is configured to house the coplanar yttrium iron garnet resonator 12 as it can be coupled with the substrate 14 in the outer area of the substrate 14. Thus, the yttrium iron garnet sphere 28 is housed by the shielding cover 48 and the coplanar coupling structure 22 assigned to the yttrium iron garnet sphere 28.

In addition, adjustment rods 56 are provided for adjusting the relative position(s) of the components of the YIG oscillator 10 within the housing 50. In some embodiments, the substrate 14 with the coplanar coupling structure 22 can be positioned via the adjustment rods 56 with respect to the YIG sphere 28.

In some embodiments, the yttrium iron garnet oscillator 10 may be manufactured by providing the substrate 14 wherein an electrically conductive material is deposited on the respective surface(s) 16, 18 so as to form the grounding areas 20, 44.

In addition, the coplanar coupling structure 22 and/or the coplanar waveguide 24 are applied on the first surface 16 of the substrate 14 in areas not covered by the electrically conductive material. The coplanar coupling structure 22 as well as the coplanar waveguide 24 may be applied by using thin-film techniques so that the respective material can be deposited on the first surface 16 of the substrate 14 in a cost-efficient manner. The respective electrically conductive material may also be applied by using thin-film techniques.

Generally, the electrically conductive material, the coplanar coupling structure 22 and/or the coplanar waveguide 24 may be applied on the substrate 14 simultaneously. Then, the substrate 14 with the components of the yttrium iron garnet resonator 12 is placed in proximity of the yttrium iron garnet sphere 28 so that an electromagnetic coupling between the yttrium iron garnet sphere 28 and the coplanar coupling structure 22 is obtained. In some embodiments, the coplanar coupling structure 22 is placed beneath the yttrium iron garnet sphere 28 so that the YIG sphere 28 covers the outer edges of the coplanar coupling structure 22 in a top view on the first surface 16 of the substrate 14.

Afterwards, the shielding cover 48 is placed on the YIG resonator 12 so that the YIG sphere 28 is covered or rather shielded by the shielding cover 48.

Since the substrate 14 is may be made of a dielectric material, the respective coplanar coupling structure 22 and/or the coplanar waveguide 24 may correspond to strip lines provided on the first surface 16 of the substrate 14.

As already mentioned, the coplanar coupling structure 22 and/or the coplanar waveguide 24 can be made of gold, for example thin film coated gold. Moreover, the electrically conductive material may also be provided by gold, in particular thin film coated gold.

In general, the electric length of the coplanar coupling structure 22 is reduced in comparison to the coupling structures used in the prior art so that the natural resonant frequency limiting the frequency range usable is shifted to higher frequencies, namely frequencies higher than 30 GHz.

Therefore, the disclosure provides high frequency YIG oscillators 10 with low phase noise.

The present application may also reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A, B, and C," for example, means (A), (B), (C), (A and B), (A and C), (B and C), or (A, B, and C), including all further possible permutations when greater than three elements are listed.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The invention claimed is:

1. A high frequency yttrium iron garnet oscillator with a coplanar yttrium iron garnet resonator, wherein the coplanar yttrium iron garnet resonator comprises an yttrium iron garnet sphere, a coplanar coupling structure and a coplanar waveguide, wherein the coplanar coupling structure is integrated with the coplanar waveguide, wherein the coplanar coupling structure and the coplanar waveguide are provided in the same plane, and wherein the coplanar coupling structure is coupled to the yttrium iron garnet sphere.

2. The yttrium iron garnet oscillator according to claim 1, wherein the coplanar coupling structure is substantially ring shaped.

3. The yttrium iron garnet oscillator according to claim 2, wherein the ratio of the diameter of the ring shaped coplanar coupling structure and the diameter of the yttrium iron garnet sphere is between 0.7 to 1.4.

4. The yttrium iron garnet oscillator according to claim 2, wherein the diameter of the ring shaped coplanar coupling structure corresponds to the diameter of the yttrium iron garnet sphere.

5. The yttrium iron garnet oscillator according to claim 1, wherein the coplanar yttrium iron garnet resonator has a recess portion that is assigned to the coplanar coupling structure.

6. The yttrium iron garnet oscillator according to claim 5, wherein the recess portion has two recess areas that merge into each other, wherein a first recess area is assigned to the coplanar coupling structure and/or wherein a second recess area is assigned to the coplanar waveguide.

7. The yttrium iron garnet oscillator according to claim 1, wherein the coplanar yttrium iron garnet resonator has a substrate with a first surface on which the coplanar coupling structure and/or the coplanar waveguide are/is provided.

8. The yttrium iron garnet oscillator according to claim 7, wherein at least the first surface of the substrate is partially provided with an electrically conductive material.

9. The yttrium iron garnet oscillator according to claim 7, wherein the substrate has a second surface opposite to the first surface that is also partially provided with an electrically conductive material.

10. The yttrium iron garnet oscillator according to claim 5, wherein the recess portion is provided within an electrically conductive material.

11. The yttrium iron garnet oscillator according to claim 10, wherein the coplanar yttrium iron garnet resonator has a substrate with a first surface on which the coplanar coupling structure and/or the coplanar waveguide are/is provided, and wherein the first surface of the substrate is substantially fully covered with electrically conductive material except for the recess portion.

12. The yttrium iron garnet oscillator according to claim 1, wherein the coplanar coupling structure and/or the coplanar waveguide are/is established by a thin-film.

13. The yttrium iron garnet oscillator according to claim 1, wherein the minimum distance between the yttrium iron garnet sphere and the coplanar coupling structure is between 100 µm and 150 µm.

14. The yttrium iron garnet oscillator according to claim 1, wherein a holder is provided that holds the yttrium iron garnet sphere.

15. The yttrium iron garnet oscillator according to claim 1, wherein a shielding cover is provided that houses the coplanar yttrium iron garnet resonator.

16. The yttrium iron garnet oscillator according to claim 1, wherein the coplanar coupling structure and/or the coplanar waveguide are/is established by strip lines.

17. A method of manufacturing a high frequency yttrium iron garnet oscillator, comprising:
providing a substrate;
applying a coplanar coupling structure on at least a portion of the first surface of the substrate by using thin-film techniques;
applying a coplanar waveguide on parts of the first surface of the substrate; and
placing an yttrium iron garnet sphere in proximity of the coplanar coupling structure so that an electromagnetic coupling between the yttrium iron garnet sphere and the coplanar coupling structure is obtained.

18. The method according to claim 17, wherein the coplanar coupling structure and the coplanar waveguide are formed simultaneously.

19. A high frequency yttrium iron garnet oscillator with a coplanar yttrium iron garnet resonator, wherein the coplanar yttrium iron garnet resonator comprises an yttrium iron garnet sphere, a coplanar coupling structure and a coplanar waveguide, wherein the coplanar coupling structure is integrated with the coplanar waveguide, and wherein the coplanar coupling structure is coupled to the yttrium iron garnet sphere, wherein the coplanar yttrium iron garnet resonator has a recess portion that is assigned to the coplanar coupling structure, and wherein the recess portion has two recess areas that merge into each other, wherein a first recess area is assigned to the coplanar coupling structure and/or wherein a second recess area is assigned to the coplanar waveguide.

* * * * *